United States Patent
Khalid (10) Patent No.: US 8,749,151 B2
(45) Date of Patent: Jun. 10, 2014

(54) SYSTEM FOR AND METHOD OF PROVIDING HIGH RESOLUTION IMAGES USING MONOLITHIC ARRAYS OF LIGHT EMITTING DIODES

(75) Inventor: Najeeb Khalid, Quebec (CA)

(73) Assignee: 4233999 Canada Inc., Westmount, QC (CA)

( * ) Notice: Subject to any disclaimer, the term of this patent is extended or adjusted under 35 U.S.C. 154(b) by 74 days.

(21) Appl. No.: 13/320,151

(22) PCT Filed: May 14, 2010

(86) PCT No.: PCT/CA2010/000739
§ 371 (c)(1),
(2), (4) Date: Nov. 11, 2011

(87) PCT Pub. No.: WO2010/130051
PCT Pub. Date: Nov. 18, 2010

(65) Prior Publication Data
US 2012/0049762 A1   Mar. 1, 2012

Related U.S. Application Data

(60) Provisional application No. 61/178,146, filed on May 14, 2009.

(51) Int. Cl.
*H05B 37/00* (2006.01)
*H05B 39/00* (2006.01)
*H05B 41/00* (2006.01)

(52) U.S. Cl.
USPC ........... 315/192; 315/193; 315/291; 315/299; 315/307

(58) Field of Classification Search
None
See application file for complete search history.

(56) References Cited

U.S. PATENT DOCUMENTS

| | | | |
|---|---|---|---|
| 4,074,318 A | 2/1978 | Kapes, Jr. | |
| 4,587,717 A | 5/1986 | Daniele et al. | |
| 4,588,883 A * | 5/1986 | Abbas | 250/205 |
| 4,837,589 A | 6/1989 | Dodge | |
| 4,916,530 A | 4/1990 | Neilson et al. | |
| 5,523,591 A | 6/1996 | Fleming et al. | |

(Continued)

FOREIGN PATENT DOCUMENTS

| | | |
|---|---|---|
| CN | 1455736 A | 11/2003 |
| CN | 1847008 A | 10/2006 |
| JP | H04-339465 A | 11/1992 |
| JP | H07-214819 A | 8/1995 |
| JP | H10-193684 A | 7/1998 |
| JP | 2007-079221 A | 3/2007 |

OTHER PUBLICATIONS

China application 201080028348.1 first office action and search report with English translation and related claims 1-27.

(Continued)

*Primary Examiner* — Anh Tran
(74) *Attorney, Agent, or Firm* — Anglehart et al.

(57) ABSTRACT

Methods and apparatus are provided to fabricate massive monolithic arrays of individually addressable light emitting diodes, assemble a plurality of such massive monolithic arrays of individually addressable light emitting diodes, control each individual light emitting diode, and to assemble the same in manner to achieve the accuracy and stability for a massive number of individually controlled light emitting diodes that can then be focused using projection optics on to a photoreceptive surface. In addition methods and apparatus are provided to move the imaging system thus described relative to the photoreceptive surface in two axes orthogonal to each other thus exposing the photoreceptive surface.

31 Claims, 7 Drawing Sheets

(56) References Cited

U.S. PATENT DOCUMENTS

| | | | |
|---|---|---|---|
| 5,917,534 A * | 6/1999 | Rajeswaran | 347/238 |
| 6,130,700 A | 10/2000 | Murayama et al. | |
| 6,303,943 B1 | 10/2001 | Yu et al. | |
| 6,849,308 B1 | 2/2005 | Speakman et al. | |
| 7,123,278 B2 | 10/2006 | Kudou | |
| 2004/0135875 A1 | 7/2004 | Wakisaka | |
| 2007/0052983 A1 | 3/2007 | Nakajima | |
| 2009/0206325 A1 | 8/2009 | Biwa et al. | |
| 2010/0127299 A1 | 5/2010 | Smith et al. | |

OTHER PUBLICATIONS

PCT/CA2010/000739 international preliminary report.

PCT/CA2010/000739 international search report with related claims 1-27.

Search report and search opinion of EP application 10774473 with related claims 1-13.

Japan application 2012-510082 office action dated Jan. 29, 2014 with related claims 1-27.

* cited by examiner

Figure 7

SYSTEM FOR AND METHOD OF PROVIDING HIGH RESOLUTION IMAGES USING MONOLITHIC ARRAYS OF LIGHT EMITTING DIODES

CROSS-REFERENCE TO RELATED APPLICATIONS

The present application is a national stage of PCT/CA2010/000739 filed on May 14, 2010, which claims priority from U.S. Provisional Application No. 61/178,146 filed May 14, 2009 entitled "Method To Obtain High Resolution Images On Photoreceptive Materials Using Massive Monolithic Arrays Of Light Emitting Diodes," the disclosure of which are hereby incorporated by reference.

TECHNICAL FIELD

Embodiments of the present disclosure relate to a high speed imaging of high resolution images on photoreceptive materials that may be coated on substrates using multiple massive individually addressable monolithic arrays of light emitting diodes (LEDs).

BACKGROUND INFORMATION

High resolution imaging on photoreceptive materials coated on to various substrates is used in manufacturing processes such as manufacture of semiconductor devices, printed circuit boards and offset printing. In such manufacturing processes, the photoreceptive material may be exposed in a manner such as to create a desired image that, when additional steps are taken, produces a usable differentiation in the photoreceptive material in the exposed areas and unexposed areas. This difference may then be used to advance the manufacturing process.

As one example, in offset printing, metal plates used may have a surface which has been differentiated between areas that are hydrophobic and areas that are hydrophilic. The plates may then exposed to water. The hydrophobic areas repel water, hydrophilic areas do not. When the plate comes in contact with ink, the ink is taken up by the areas where there is no water. This pattern of ink may then be transferred indirectly to paper, thus generating a printed page.

Methods of creating images on these substrates have evolved over the decades from projecting illuminated images through a lens onto a substrate to the use of lasers and complex expensive mechanism to scan the surface of the substrate. Common to all known imaging methods is that the speed is constrained if the solution is to be practical in terms of cost.

Embodiments of the present disclosure provide a method for imaging that is high speed and cost effective.

Embodiments of the present disclosure provide methods and apparatus to change or adapt the light source to the spectral sensitivity of the substrate.

Furthermore, embodiments of the present disclosure provide methods and apparatus for transporting an imaging mechanism over the substrate in such a fashion as to provide the required precision, accuracy, and resolution for high speed resolution imaging.

Embodiments of this disclosure additionally provide methods and apparatus of controlling the intensity of the light emitting diodes through the using of voltage and current characteristics.

Embodiments of this disclosure also provide for the methods and apparatus to control each individual light in the monolithic light emitting diode array at a speed consistent with the overall imaging requirements.

SUMMARY OF THE DISCLOSURE

In accordance with embodiments of this disclosure, methods and apparatus are provided to fabricate massive monolithic arrays of individually addressable light emitting diodes, assemble a plurality of such massive monolithic arrays of individually addressable light emitting diodes, control each individual light emitting diode, and to assemble the same in manner to achieve the accuracy and stability required for a massive number of individually controlled light emitting diodes that can then be focused using projection optics on to a photoreceptive surface. In addition methods and apparatus are provided to move the imaging system thus described relative to the photoreceptive surface in two axes orthogonal to each other thus exposing the photoreceptive surface.

The methods describe herein ensure the accuracy of the pixels produced by the methods and apparatus as well as the density that results in the imaging speed and the quality demanded by imaging systems for the applications contemplated in embodiments of this disclosure.

BRIEF DESCRIPTION OF THE DRAWINGS

The present invention, together with further objects and advantages, may best be understood by reference to the following description taken in conjunction with the accompanying drawings, in the several figures of which like reference numerals identify like elements, and in which.

DETAILED DESCRIPTION OF PREFERRED EMBODIMENTS

This disclosure describes a method of applying the art of manufacturing light emitting diodes to fabricate an array, preferably linear but not limited to, in a pattern that is compatible with assembly of plurality of such arrays into one massive array. Further, each array may be on a different substrate and process for achieving different levels of efficiency and wavelength.

Manufacturing of light emitting diodes may include selecting materials for the band gap energy desired to achieve the target wavelength. Embodiments of the present disclosure are independent of the underlying semiconductor technology or methods used to manufacture the light emitting diodes. The disclosure provided herein applies to any form of manufacturing of the light emitting diodes.

In a semiconductor manufacturing process a highly pure crystal wafer may be exposed to specific impurities to build the different regions to form the devices required. The pattern of these regions may be formed through a selective etching, deposition, and diffusion processes. The selective etching may take place through repeated coating of the crystal surface with a photo resistant material. This photo resistant material may then be exposed to a desired pattern carried on glass, termed a mask, using light of wavelength matching the sensitivity of the photo resistant material (e.g., ultra violet).

According to one or more embodiments, the light emitting diodes may be placed in a staggered manner such that alternate light emitting diodes are found in alternate columns. This may allow for gaps between adjacent light emitting diode structures facilitating the semiconductor fabrication process. Gaps between adjacent light emitting diodes present a challenge to use the array for high resolution imaging. As the adjacent light emitting diodes are now only adjacent in the orthogonal axis and not the vertical axis, conventional methods of imaging may result in imaging difficulties. According to one or more embodiments of the present disclosure methods and apparatus may be used to make adjacent light emitting diode structures appear adjacent, thus creating a virtual massive linear array of lights.

Figure 1:
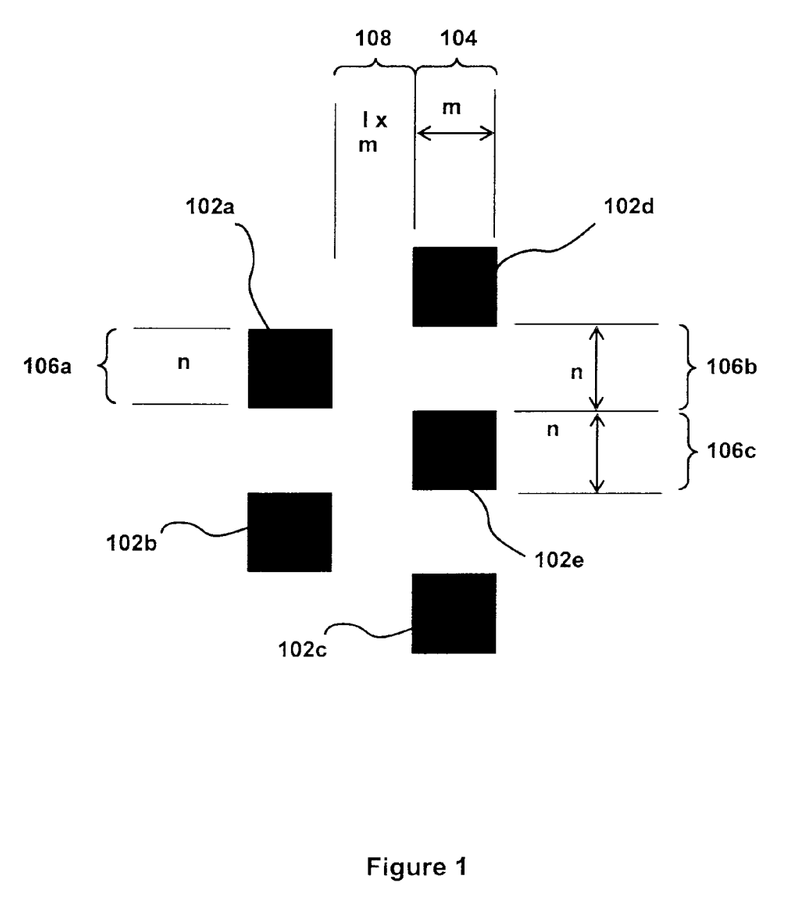
FIG. 1 is a pattern of the individual light emitting diode elements in an array, according to an exemplary embodiment.

FIG. 1 is a pattern of the individual light emitting diode elements in the array showing the elements as square configuration of dimension m×n where m=n, where m is the desired width of an LED element and n is the desired height of the LED element. According to some embodiments, there may be two rows of elements, parallel to each other and separated by a known distance that is, preferably, an integer multiple of the width m of the element, that is l×m where l is a positive non-zero integer and m is the dimension. Vertical separation may be equal to the height (n) of the element. The number of elements can vary according to size of wafer and the application.

A set of masks may define the pattern of the devices created on the crystal wafer. Thus the pattern of the light emitting diodes forming individual elements of a massive array, each individually controllable may be constructed. According to some embodiments, individual light emitting diodes elements may be formed as squares of dimension m×n (where n=m) in two columns separated by a distance n in the vertical direction (height) and a distance of l×m in the horizontal (width), where l is a non-zero positive integer. As illustrated in FIG. 1, LED elements 102a-102(e) may be separated by a vertical distance of n as shown in space 106b. The vertical distance n may be equal to the height of the LED elements 102a-102(e) as shown in 106a and 106c. LED elements 102a-102(e) may be separated by a horizontal distance of l×m as shown in space 108. Horizontal distance m may be equal to the width of LED elements 102a-102(e) as shown in 104.

According to an exemplary embodiment, the dimensions may be m=n=20 micrometers and l=4 and the number of elements in the array being 2048 in two columns of 1024 each.

As illustrated in FIG. 1, LEDs 102a and 102b may be LEDs in a first column and LEDs 102c, 102d, and 102e may be LEDs in a second column. The staggered arrangement of the two columns results in a space between any two light emitting diodes in one column (e.g., 106b) that aligns with a light emitting diode in an adjacent column (106a). This staggered pattern may facilitate fabrication of the wafer. As discussed above, this may present a challenge to imaging. According to some embodiments, the timing of the activation may depend on the row the light emitting diode belongs to. The two rows may be activated in such a manner that the photoreceptors see the lights in one row. This is discussed in further detail in reference to FIG. 6 below.

Figure 2:
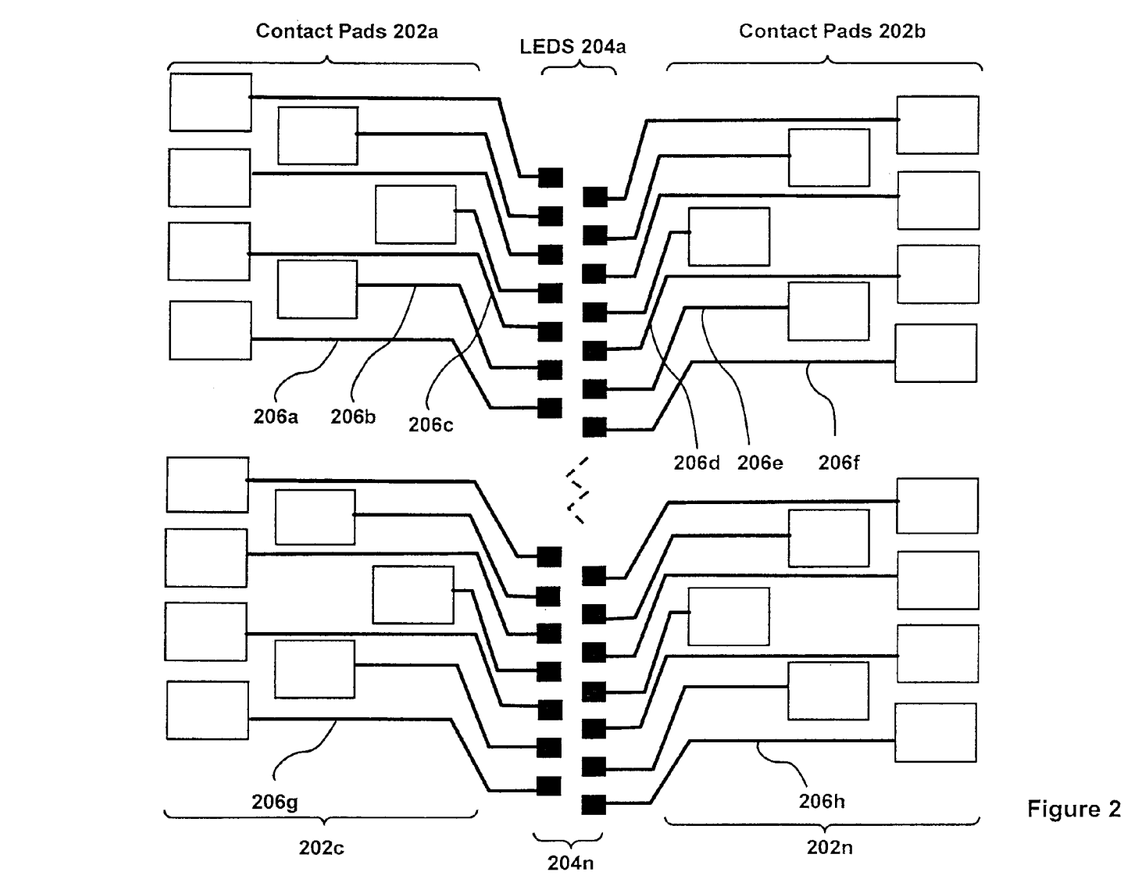
FIG. 2 is a detail top layout of the arrangement of the light emitting diodes forming a massive array, according to an exemplary embodiment.

FIG. 2 is a detail top layout of the arrangement of the light emitting diodes forming a massive array. The total number of elements in each column may be determined by the yield curve of the manufacturing process. Each diode element 204 is shown to have a conductor 206 routed to a bonding pad or contact pad 202. Size of the bonding pads 202 may be determined by packaging technology.

Each individual light emitting diode element is connected to a bonding pad for wire bonding the element to the electronics assembly thus providing a method to control each light emitting diode individually and separately. The number of elements in the array may be limited by the manufacturing processes.

It should be clear to those conversant with the current art of semiconductor fabrication that a single wafer will produce devices that have a very small spread in their characteristics. Thus a light emitting diode array, being a part of a wafer, will have light emitting diodes that emit light of equal intensity for equal current, and may have an identical relationship between forward current and forward voltage. Light emitting diodes of the array may have a similar beam structure within the requirements of the applications envisioned in this disclosure. Due to the high purity of the semiconductor crystal wafer and the consistency of the fabrication process, the light emitting diode array may have the homogeneity required for graphic arts and other high quality high resolution high accuracy applications.

The arrangement described above may, when controlled appropriately and as described further below, generate a vertical line of pixels on the image plane.

The positioning of each array in the assembly may require a high precision of placements that may be achievable using standard semiconductor mask alignment techniques.

Exemplary embodiments of these arrays contain a minimum of 256 LEDs and as many as the size of wafer will allow. The limitation of the wafer may be determined by available crystal wafer size. According to some embodiments, these arrays may have two rows of 1024 LED elements each.

Figure 3:
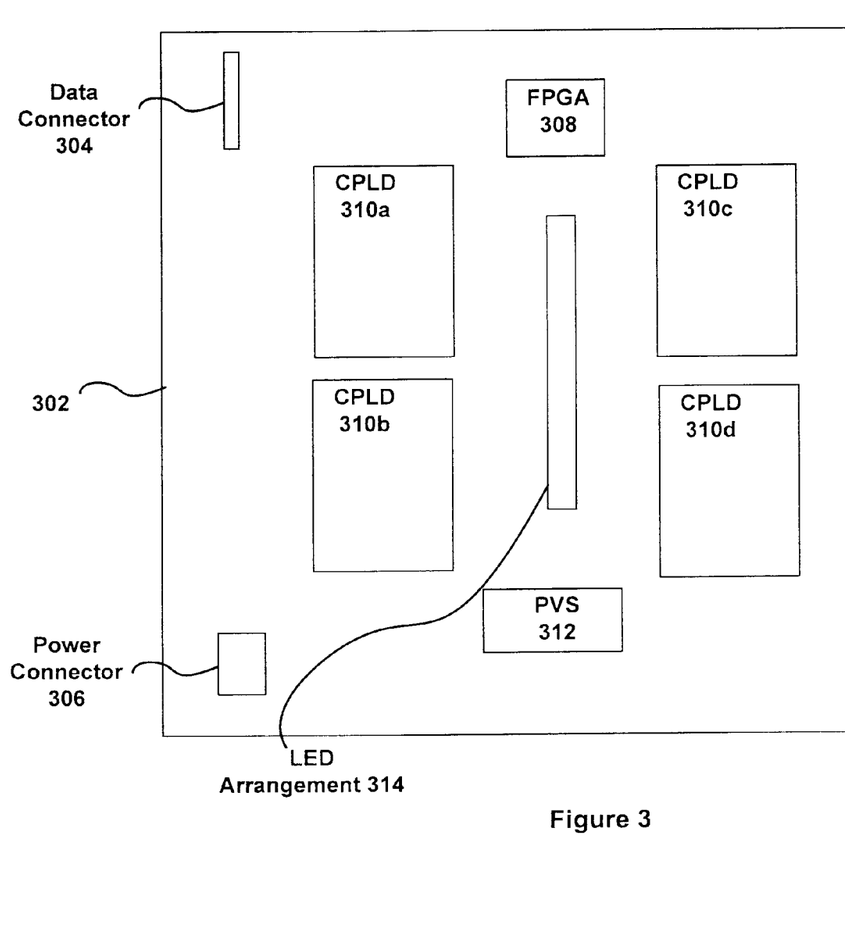
FIG. 3 illustrates a plan of arrays and control electronics on a Printed Circuit Board (PCB), according to an exemplary embodiment.

FIG. 3 illustrates a plan of arrays and control electronics on a Printed Circuit Board (PCB) 302, according to an exemplary embodiment.

PCB 302 may carry the electronics, shown as a block diagram in FIG. 3. The electronics may receive data and control information from a remote source (e.g., a computer connected via data connector 304). Exemplary control information may include, amongst other information, light intensity required, tables representing the light emitting diodes, and forward current to intensity characteristics of the light emitting diodes. Power connector 306 may connect to electrical mains or other electrical power supply.

The data and control information may be received by one or more circuits embedded in the PCB (e.g., Field Gate Programmable Array (FPGA) 308) via data connector 304. Data received by FPGA 308 or other circuits may be passed onto the shift registers in a first in first out basis and then to the driving electronics. For example, data may be received by FPGA 308 and then passed to one or more Complex Programmable Logic Devices (CPLD) 310a, 310b, 310c, and 310d. Each of Complex Programmable Logic Devices (CPLD) 310a, 310b, 310c, and 310d may be responsible for a subset of LED elements (e.g., 512 LED elements for each CPLD). Control information may be used to control the light intensity in the light emitting diodes of LED arrangement 314 through one or more methods and/or components. Control information may also be used for setting the parameters for the timing and control electronics.

As the light emitting diodes within an array are formed simultaneously on one wafer, the light intensity to current relationship may be well within the range of variations tolerated by the applications visualized in this disclosure. Therefore to control the intensity of the light emitting diodes within one monolithic array, according to some embodiments, a programmable voltage source may be used (e.g. Programmable Voltage Source (PVS) 312). By changing the voltage applied to the light emitting diodes using a programmable voltage source, the current to diodes in an array may be changed and may thus change the intensity of the diode emissions. The drive electronics may contain storage for retaining the relationship of the current vs light intensity for the array (e.g., non-volatile electronic storage such as processor non-volatile memory that maintains its contents regardless of availability of power). According to some embodiments, CPLDs 310a, 310b, 310c, and 310d may store current to light intensity ratio data for the one or more subsets of LED devices. For example, CPLD 310a may store and utilize current to light intensity data for LED elements 0-511 of an array, CPLD 310b may store and utilize current to light intensity data for LED elements 512-1023 of an array, CPLD 310c may store and utilize current to light intensity data for LED elements 1024-1535 of an array, and CPLD 310d may store and utilize current to light intensity data for LED elements 1536-2048 of an array.

Intensity control as described above may be used to generate equal intensity in two or more light emitting diode arrays used to form a dense array as described above.

Controlling the intensity of light in each individual light emitting diode element may also be achieved using pulse width modulation of the current through each LED element. This pulse width modulation may be achieved through the use of a table of data in the non volatile memory that may be part of an embedded processor. The table of data may be built during an initial calibration period where the light intensity may be measured by an integrated power sensor (e.g., a photo-receptor) mounted in an apparatus.

To calibrate the elements of the array, each light emitting diode element may be turned on one at a time, and a reading from a power sensor may be obtained. The reading from the power sensor may then be stored in non-volatile memory. These values, one for each element, may then be used to calculate the pulse width modulation period required to correct for the non-uniformity. This data may then be transferred to the appropriate control electronics so that when the light emitting diodes are switched on, they are switched off depending on this pulse width definition transferred from the non-volatile memory to the control electronics (e.g., CPLDs). As different photo receptors have different sensitivity to difference in intensity, one or both methods may be used to achieve the desired uniformity of light intensity.

In other embodiments, to increase the efficiency of capture of light from the light emitting diodes an array of micro lenses may be used. Another variation of one or more embodiments may use a higher degree of drivers in each Complex Programmable Logic Device (CPLD). One or more embodiments may use specialized analog integrated circuits to drive specific current control of each light emitting diode.

Figure 4:
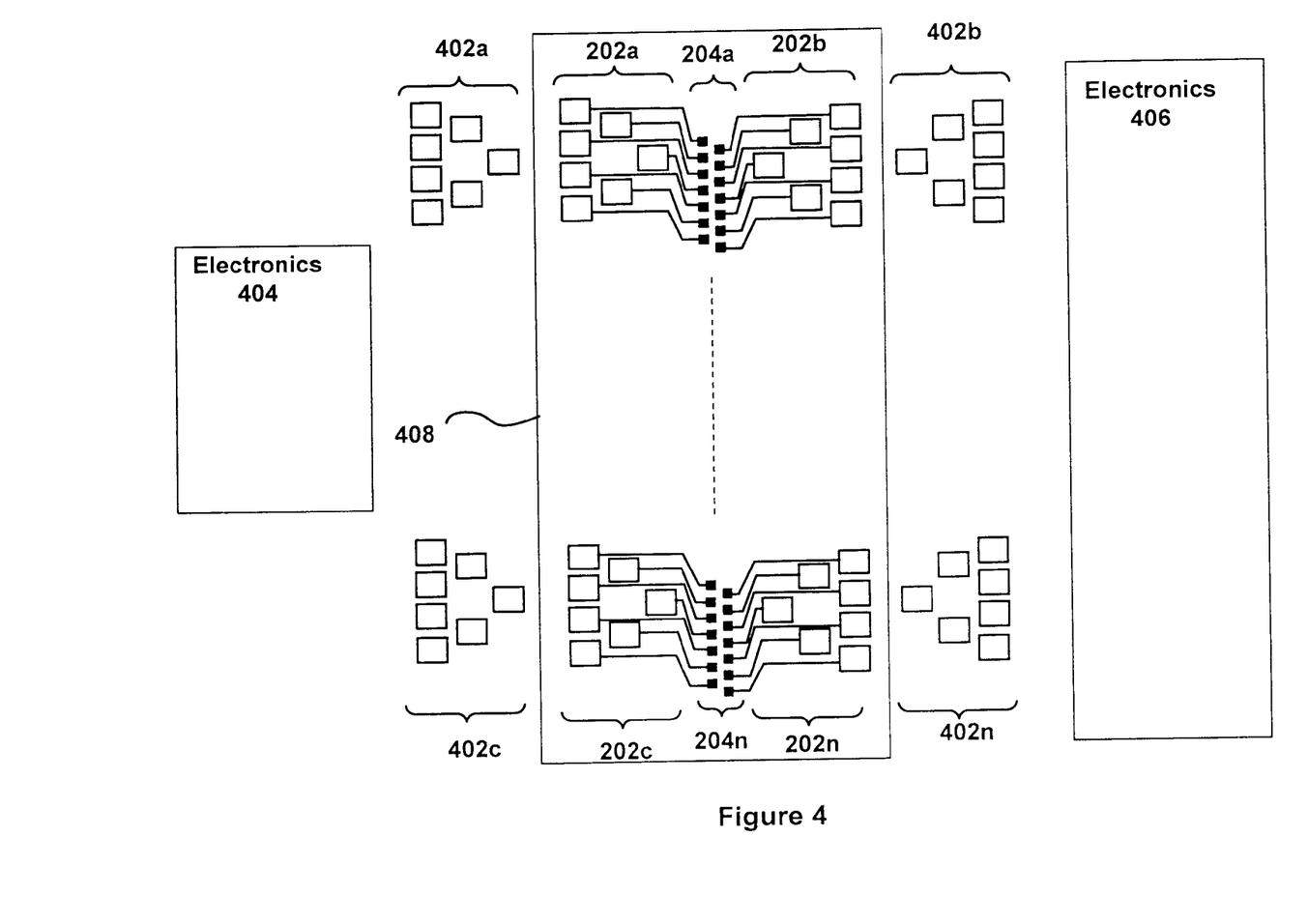
FIG. 4 shows layout of an array with bonding pads and the bonding pads on a PCB, according to an exemplary embodiment.

FIG. 4 illustrates a layout of an array with bonding pads and the bonding pads on the PCB. According to some embodiments, an imaging system as illustrated in FIG. 4 may be capable of imaging 2048 dots on a photoreceptive surface. In other embodiments this number may be increased by a multiple of k, where k may also increase or decrease. As illustrated, k may equal one. As shown in FIG. 4, PCB 408 may contain LEDs 204a to 204n. LEDs may be connected by connectors to bonding pads 202a, 202b, 202c, and 202d. Bonding pads 202a may be operatively connected to bonding pads 402a. Bonding pads 202b may be operatively connected to bonding pads 402b. Bonding pads 202c may be operatively connected to 402c. Bonding pads 202n may be operatively connected to bonding pads 402d. Electronics 404 may connect to bonding pads 402a and bonding pads 402c. Electronics 406 may connect to bonding pads 402b and 402n.

Figure 5:
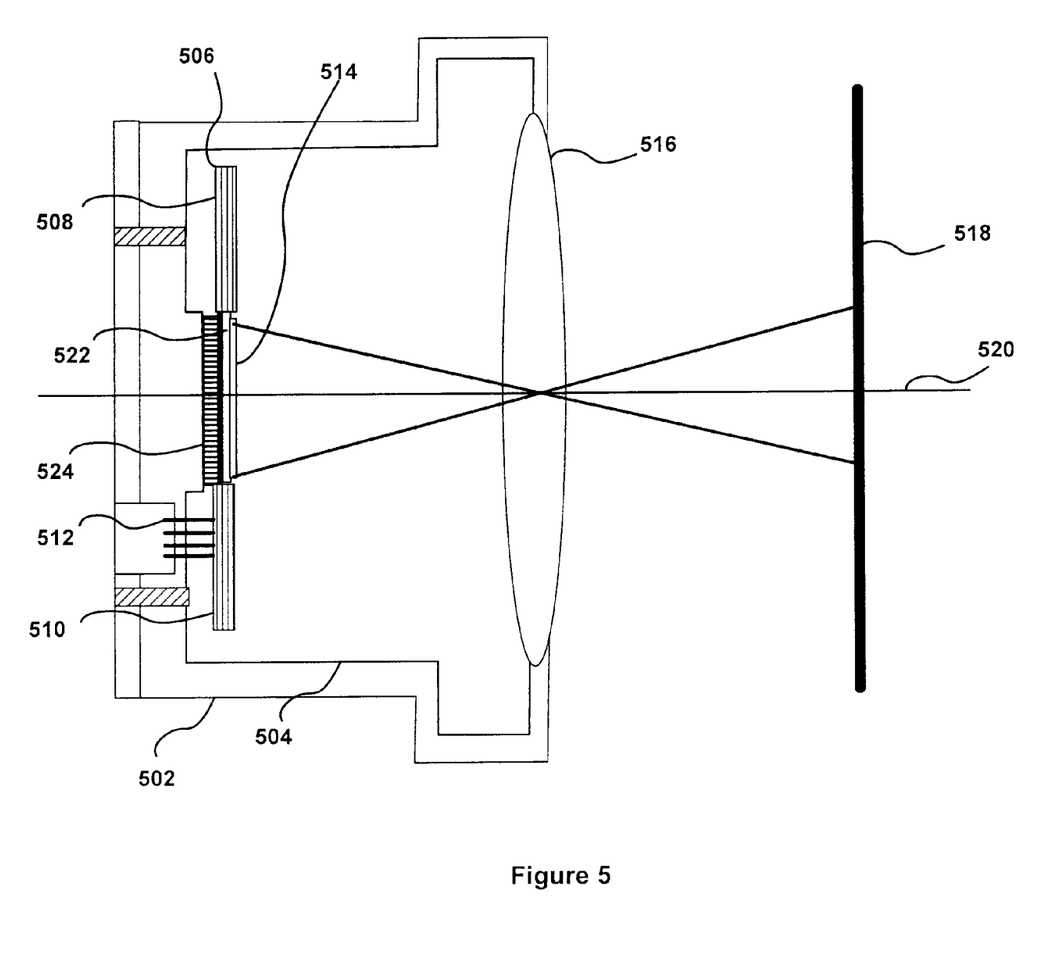
FIG. 5 depicts a side view of the arrangement of an imaging assembly, according to an exemplary embodiment.

FIG. 5 depicts a side view of the arrangement of the imaging assembly 502. The LED Array 514 may be mounted on a copper block 522 which may also carries the PCB containing the electronics 506 and 510. This assembly may then be enclosed in an aluminum or copper housing 504 with a projection lens 516 mounted at one end. The housing 504 may then sealed with inert gas replacing air. Outlets are provided on the exterior of the housing for the power, data and control signals (e.g., outlets 512). Additional outlets can be provided if liquid cooling is required.

The massive individually addressable array of light emitting diodes 514 may be mounted on copper base 522. This copper base 522 may then be mounted on a Peltier cooler 524 to provide thermal management of the device. The Peltier cooler 524 may then be controlled via a feed back loop consisting of electronics, temperature sensors and the Peltier cooler itself. Massive individually addressable array of light emitting diodes 514 may project LED emissions via lense 516 onto imaging surface 518. Various imaging ratios may be used. As depicted by optical axis 520 in FIG. 5, according to an exemplary embodiment, a one-to-one ratio may be used. Although a single complex lense is depicted, according to one or more embodiments, a plurality of micro lenses may be provided (e.g., an array of lenses and/or a lense per each LED element).

Figure 6:
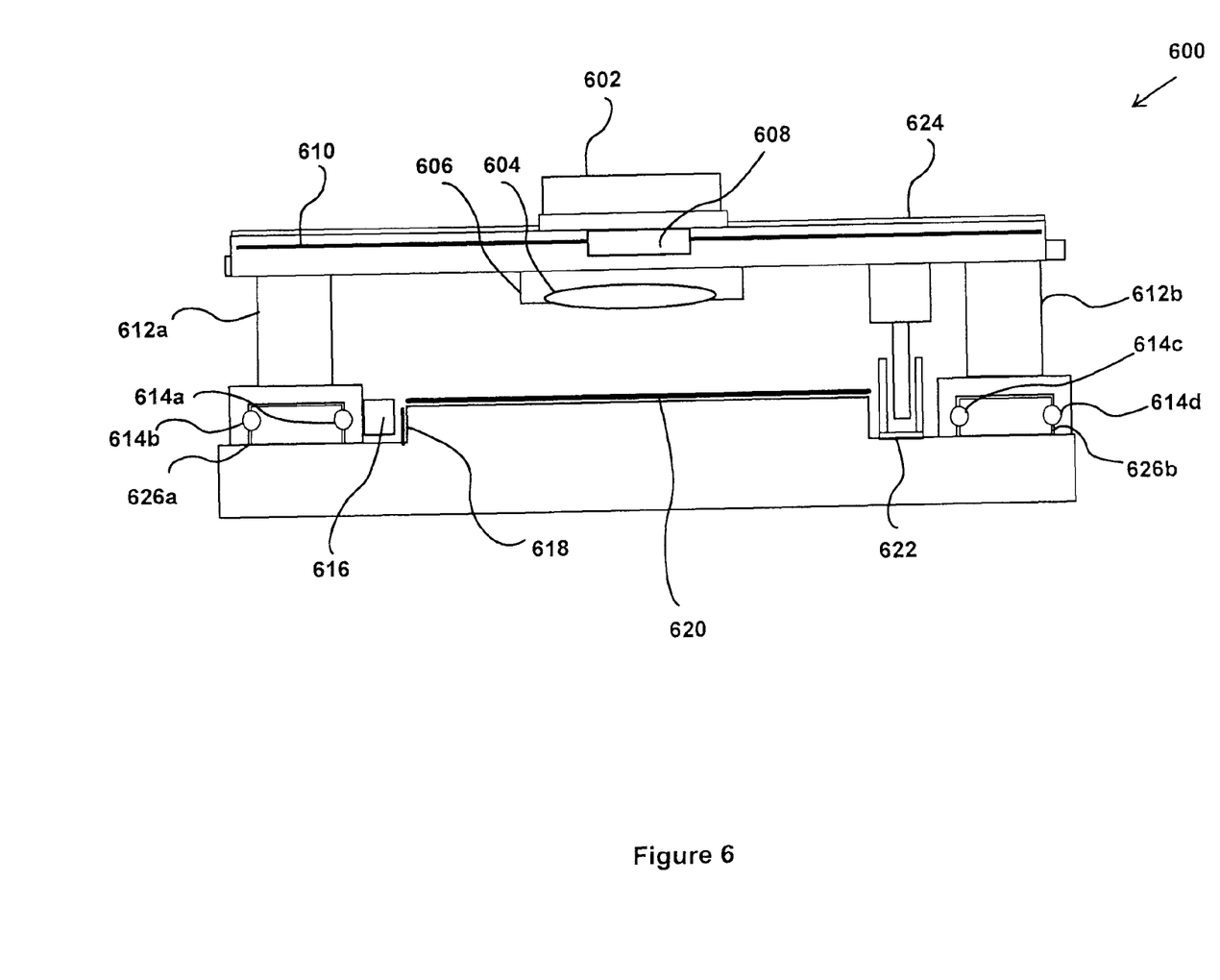
FIG. 6 depicts a plan view of the apparatus to support the photoreceptive coated material and the transport components for the two axes, according to an exemplary embodiment.

FIG. 6 depicts a plan view of the apparatus to support the photoreceptive coated material and the transport components for the two axes. As illustrated in FIG. 6, imaging apparatus 600 may contain supports 612a and 612b which may support imaging assembly 602 containing tense 604 and housing 606 over imaging surface 620. According to some embodiments, imaging assembly 602 may contain one or more components as discussed above in reference to FIG. 5 (e.g., massive individually addressable array of light emitting diodes 514). An array contained in imaging assembly 602 may be parallel to imaging surface 620 and lense 604. Imaging assembly 602 may be mounted on rails 624 which may allow movement along an X axis. Encoder strip 610 may run across a range of movement of imaging assembly 602 on rails 624. Encoder strip 610 may provide X axis positional indicators (e.g., magnetic, optical, etc.) to encoder read head 608. Imaging assembly 602 may moved along rails 624 by one or more servo mechanical devices (e.g., a linear motor). As further illustrated in FIG. 6, 614a and 614b may be bearings in linear rail 626a. Linear rail 626b may contain bearings 614c and 614d. Linear rails 626a and 626b may allow motion along a Y axis for imaging assembly 602. Encoder read head 616 may receive Y axis positional indicators from encoder strip 618.

The projection lens 604 may be selected to project the image with the desired reduction to achieve the desired addressability and resolution. According to some embodiments, imaging surface 620 may be a part of a vacuum system facilitating imaging by holding the imaging surface rigid.

The imaging assembly may then be mounted on a two axis motion system as shown in FIG. 6, with the photoreceptive material and its substrate on a flat table (e.g., imaging surface 620). In this embodiment, the photoreceptive material may not move, the imaging system is moved in the two axes. The first motion may be across the photoreceptive material, referred to as the fast scan in the art; the second motion may be orthogonal to this first motion, referred to as the slow scan, and then the imaging system may reverse direction. Each fast scan may allow the imaging system to traverse completely over the photoreceptive material and the imaging system may move orthogonally exactly the distance required for the last light emitting diode element of one scan to be adjacent to the first element of the second scan. This accuracy may be possible by the linear motion system described above. The adjacency of light emitting diodes between scans may be equal to the adjacency of the light emitting diode elements within a scan.

The two axis motion system may control light emitting diodes by two axis servo system with very high resolution linear encoders and DC linear motors on both axis. The linear motion systems are capable of the acceleration and high resolution as well as very high velocity control light emitting diode. These attributes may provide a high quality imaging systems for use in the applications envisioned for preferred embodiments.

During the motion of an imaging system across the photoreceptive material, the light emitting diodes may be activated through the data stored in the CPLDs. The timing of the activation may depend on the row the light emitting diode belongs to. During initial phase of commissioning the total system, software may be used to adjust the relationship of activating the two rows of light emitting diodes in each array. This software may use the encoder signal from the linear encoder of the linear motor to derive a signal that ensures that the two rows are activated in such a manner that the photoreceptors see the lights in one row. This may be achieved by firing the two columns of LEDs in the array at different times so that the firing of each takes place as the particular column is over the same point on the imaging surface.

When the fast scan reaches its end of travel, the servo system may reverse the direction of the motion while it advances the fast scan mechanism orthogonally (e.g., by a distance exactly equal to p*q*r where p is the number of elements in the led array, q is the pitch of the projected elements on the photoreceptor, and r is the number of led arrays in an imaging assembly). According to one or more embodiments, the distance for a specific application, imaging on photopolymer plates for newspaper application, could be 2048*20*4=163840 microns or 163.84 mm.

The number of fast scans used may depend on the ration of the total length of the photoreceptive materials and the orthogonal distance between subsequent fast scans.

Figure 7:
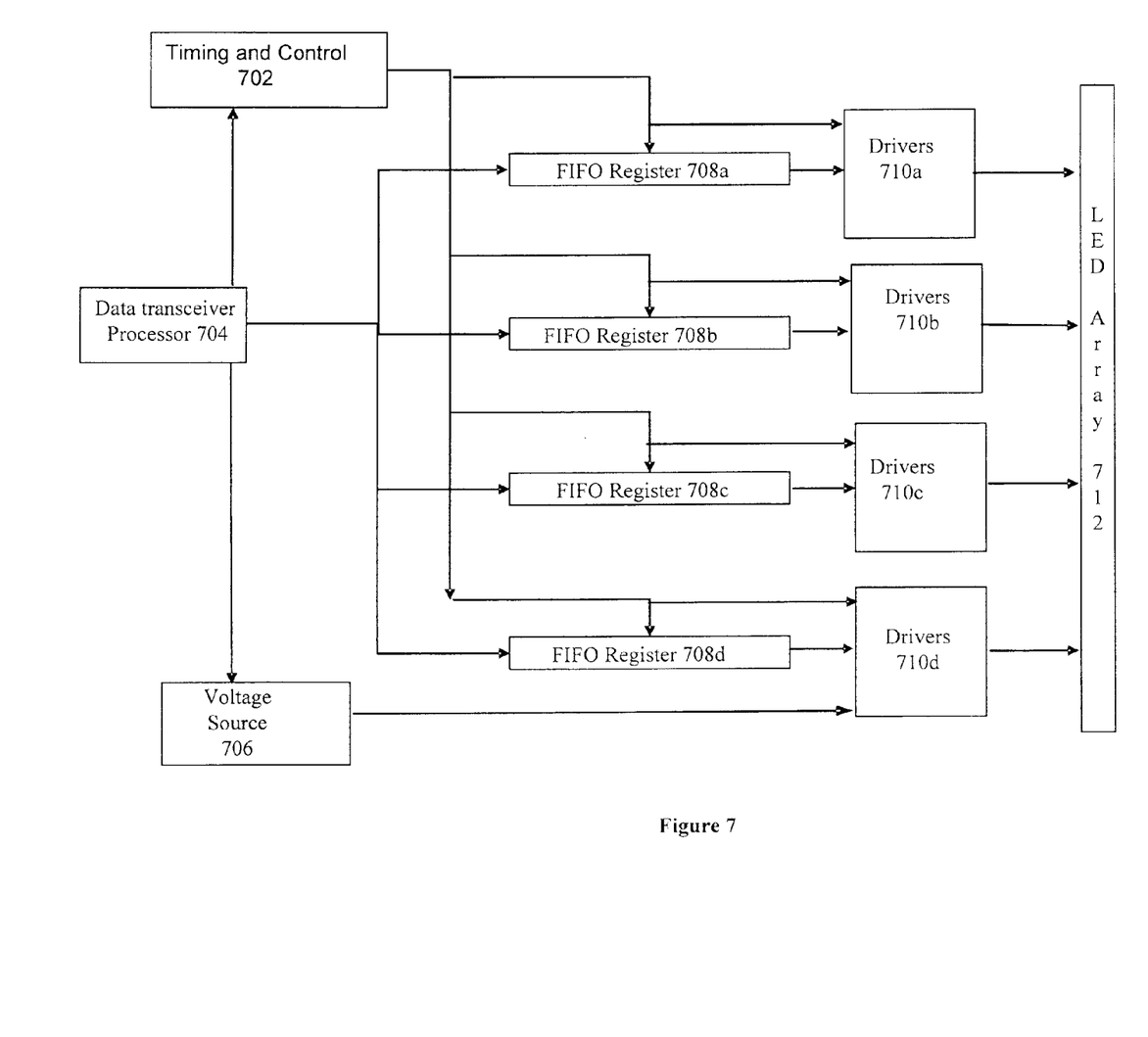
FIG. 7 is a system block diagram depicting data and control information management, according to an exemplary embodiment.

FIG. 7 is a system block diagram depicting data and control information management, according to an exemplary embodiment. Data and control information may be received at data transceiver processor 704 from an external source that may create the raster image to be imaged. This data may be sent to FIFO shift registers 708a, 708b, 708c, and 708d that may be capable of buffering the data so that as one set of data is being shifted out, the next can be shifted in. The control information may be used to set the voltage of the voltage source 706 and to set the temperature and the variables for the timing and control system 702. The timing and control system 702 responds to the variable set as well as the encoder signals coming from the XY motion systems. The drivers 710 are activated as the imaging assembly is moving in relation to the encoder, which represents the physical location of the imaging assembly and as such, the position of the LED array elements 712 in relation to the photoreceptor on the imaging bed. Although voltage source 706 is depicted as connected to drivers 710d, it may be understood that voltage source 706 may be connected to all drivers 710 (e.g., drivers 710a, 710b, 710c, and 710d).

It is further noted that the software described herein may be tangibly embodied in one or more physical media, such as, but not limited to, a compact disc (CD), a digital versatile disc (DVD), a floppy disk, a hard drive, read only memory (ROM), random access memory (RAM), as well as other physical media capable of storing software, or combinations thereof. Moreover, the figures illustrate various components separately. The functions described as being performed at various components may be performed at other components, and the various components may be combined or separated. Other modifications also may be made.

In the preceding specification, various preferred embodiments have been described with references to the accompanying drawings. It will, however, be evident that various modifications and changes may be made thereto, and additional embodiments may be implemented, without departing from the broader scope of invention as set forth in the claims that follow. The specification and drawings are accordingly to be regarded in an illustrative rather than restrictive sense.

I claim:

1. A method of providing high resolution images, comprising:
   providing an array of multiple parallel columns of individually addressable light emitting diodes, the array being fabricated from a wafer, the columns of light emitting diodes being arranged on the wafer in a staggered pattern such that a space between any two light emitting diodes in any column aligns with at least one light emitting diode in a different column, the staggered pattern facilitating fabrication of the wafer;
   determining an intensity of each of the light emitting diodes; and
   controlling light emitting diode emissions using the determined intensity of each of the light emitting diodes to form a high resolution image on a photoreceptor.

2. The method of claim 1, wherein controlling light emitting diode emissions comprises:
   calculating a pulse width modulation period for each of the light emitting diodes based on the measured intensity of each of the light emitting diodes, the calculated pulse width modulation period being configured to correct for non-uniformity of one or more of the light emitting diodes.

3. The method of claim 2, further comprising:
   storing the calculated pulse width modulation period for each of the light emitting diodes.

4. A method of providing high resolution images, comprising:
   providing an array of individually addressable light emitting diodes, the array being fabricated from a wafer;
   determining an intensity of each of the light emitting diodes; and
   controlling the intensity of light emitting diodes of the array using the determined intensity of each of the light emitting diodes using a programmable voltage source to regulate a voltage provided to the array to form a high resolution image on a photoreceptor, wherein regulation of the voltage provides control of a current to the light emitting diodes of the array and control of the intensity of the light emitting diode emissions.

5. A method of providing high resolution images, comprising:
- providing an array of individually addressable light emitting diodes, the array being fabricated from a wafer;
- determining an intensity of each of the light emitting diodes;
- controlling light emitting diode emissions using the determined intensity of each of the light emitting diodes to form a high resolution image on a photoreceptor;
- regulating motion of an assembly holding the array over an imaging surface of the photoreceptor in a X axis using a first encoder read head and a first encoder strip, the first encoder read head movement being synchronized with movement of the array along the X axis and the first encoder strip providing X axis positional indicators to the first encoder read head; and
- regulating the motion of the assembly holding of the array over the imaging surface in a Y axis using a second encoder read head and a second encoder strip, the second encoder read head movement being synchronized with movement of the array along the Y axis and the second encoder strip providing Y axis positional indicators to the second encoder read head,
- wherein the X axis positional indicators and the Y axis positional indicators provide positioning control of the array over the imaging surface to allow high resolution imaging.

6. The method of claim 5, wherein the X axis positional indicators and the Y axis positional indicators are used in calculating timing of the emission of the individual light emitting diodes of the array.

7. The method of claim 1, wherein determining the intensity of each of the light emitting diodes comprises measuring the intensity of each of the light emitting diodes using an integrated power sensor.

8. The method of claim 7, wherein the integrated power sensor is a photo-receptor.

9. The method of claim 1, wherein the array is comprised of first and second parallel columns of light emitting diodes.

10. The method of claim 9, wherein the columns of light emitting diodes are arranged on the wafer such that a space between any two light emitting diodes in the first column aligns with a light emitting diode in the second adjacent column.

11. The method of claim 1, wherein timing and positioning of the emissions of the columns of light emitting diodes causes emissions of the columns of light emitting diodes to appear as a single column to the photoreceptor opposite the columns of light emitting diodes.

12. An apparatus providing high resolution images, comprising:
- an array of multiple parallel columns of individually addressable light emitting diodes, the array being fabricated from a wafer, the columns of light emitting diodes being arranged on the wafer in a staggered pattern such that a space between any two light emitting diodes in a column aligns with at least one light emitting diode in a different column, the staggered pattern facilitating fabrication of the wafer;
- an integrated power sensor configured to determine an intensity of each of the light emitting diodes; and
- an electronic controller for controlling light emitting diode emissions using the determined intensity of each of the light emitting diodes to form a high resolution image on the photoreceptor.

13. The apparatus of claim 12, wherein further comprising:
- a computer processor configured to calculate a pulse width modulation period for each of the light emitting diodes based on the measured intensity of each of the light emitting diodes, the calculated pulse width modulation period being configured to correct for non-uniformity of one or more of the light emitting diodes.

14. The apparatus of claim 13, further comprising:
- electronic storage for storing the calculated pulse width modulation period for each of the light emitting diodes.

15. An apparatus providing high resolution images, comprising:
- an array of individually addressable light emitting diodes, the array being fabricated from a wafer;
- an integrated power sensor configured to determine an intensity of each of the light emitting diodes;
- an electronic controller for controlling light emitting diode emissions using the determined intensity of each of the light emitting diodes to form a high resolution image on a photoreceptor; and
- a programmable voltage source for controlling the intensity of light emitting diodes of the array, the programmable voltage source regulating a voltage provided to the array, wherein regulation of the voltage provides control of a current to the light emitting diodes of the array and control of the intensity of the light emitting diode emissions.

16. An apparatus providing high resolution images, comprising:
- an array of individually addressable light emitting diodes, the array being fabricated from a wafer;
- an integrated power sensor configured to determine an intensity of each of the light emitting diodes;
- an electronic controller for controlling light emitting diode emissions using the determined intensity of each of the light emitting diodes to form a high resolution image on a photoreceptor;
- a first encoder read head and a first encoder strip for regulating motion of an assembly holding the array over an imaging surface of the photoreceptor in a X axis, the first encoder read head movement being synchronized with movement of the array along the X axis and the first encoder strip providing X axis positional indicators to the first encoder read head; and
- a second encoder read head and a second encoder strip regulating the motion of the assembly holding the array over the imaging surface in a Y axis, the second encoder read head movement being synchronized with movement of the array along the Y axis and the second encoder strip providing Y axis positional indicators to the second encoder read head,
- the electronic controller being configured to use the X axis positional indicators and the Y axis positional indicators to provide positioning control of the array over the imaging surface to allow high resolution imaging.

17. The apparatus of claim 16, wherein the electronic controller uses the X axis positional indicators and the Y axis positional indicators to calculate timing of the emission of the individual light emitting diodes of the array.

18. The apparatus of claim 16, further comprising:
- a first linear motor for moving the assembly holding the array along the X axis over the imaging surface; and
- a second linear motor for moving the assembly holding the array along the Y axis over the imaging surface,
- wherein the linear motors are controlled by a computer processor.

19. The apparatus of claim 12, wherein the array is a replaceable array.

20. The apparatus of claim 12, wherein the integrated power sensor is used to determine an intensity of each of the light emitting diodes to calibrate emissions of each of the light emitting diodes based on at least one of: replacement of the array; a periodical recalibration of the intensity of light emitting diodes; and detection of a deterioration in imaging quality.

21. The apparatus of claim 12, further comprising:
a plurality of micro lenses configured to collect light from the light emitting diodes.

22. The apparatus of claim 12, further comprising:
a second array of individually addressable light emitting diodes, the second array fabricated from a second wafer.

23. The apparatus of claim 12, wherein the electronic controller comprises a Complex Programmable Logic Device (CPLD).

24. An apparatus providing high resolution images, comprising:
a plurality of arrays of individually addressable light emitting diodes, each array being fabricated from a wafer;
an integrated power sensor configured to determine an intensity of each of the light emitting diodes;
an electronic controller for controlling light emitting diode emissions using the determined intensity of each of the light emitting diodes to form a high resolution image on a photoreceptor; and
an assembly holding the plurality of arrays over an imaging surface, the assembly mounting the plurality of arrays on a ceramic substrate, the ceramic substrate being configured to reduce temperature related variations in size of the plurality of arrays during operation of the arrays.

25. An apparatus providing high resolution images, comprising:
a plurality of arrays of individually addressable light emitting diodes, each array being fabricated from a wafer;
an integrated power sensor configured to determine an intensity of each of the light emitting diodes;
an electronic controller for controlling light emitting diode emissions using the determined intensity of each of the light emitting diodes to form a high resolution image on a photoreceptor;
a Peltier cooler configured in a closed loop system, the Peltier cooler being configured to reduce temperature related variations in size of the plurality of arrays during operation of the arrays; and
an assembly holding the plurality of arrays over an imaging surface of the photoreceptor, the assembly mounting the plurality of arrays on a copper base, the copper base being mounted on the Peltier cooler.

26. The apparatus of claim 25, further comprising:
a housing holding the assembly and at least one lens over the imaging surface, the assembly being sealed and filled with an inert gas.

27. The apparatus of claim 25, wherein different arrays are configured to contain LEDs emitting at different wavelengths.

28. The method of claim 1 comprising controlling temperature variations between multiple arrays of light emitting diodes.

29. The apparatus of claim 12, wherein the electronic controller is further configured to control timing of the light emitting diodes to cause emissions from all columns of light emitting diodes to appear as a single column to a photoreceptor opposite the columns of light emitting diodes.

30. A method of providing high resolution images, comprising:
providing an array of individually addressable light emitting diodes, the array being fabricated from a wafer, the light emitting diodes being arranged on the wafer in a staggered pattern with respect to a direction of motion such that a space between any two neighboring light emitting diodes aligns with at least one light emitting diode;
regulating motion of an assembly holding the array over an imaging surface of a photoreceptor along said direction of motion; and
timing an emission of the light emitting diodes to cause emissions from all of light emitting diodes to appear as a single column to the photoreceptor opposite the pattern of light emitting diodes.

31. An apparatus providing high resolution images, comprising:
an array of individually addressable light emitting diodes, the array being fabricated from a wafer, the light emitting diodes being arranged on the wafer in a staggered pattern with respect to a direction of motion such that a space between any two neighboring light emitting diodes aligns with at least one light emitting diode;
an encoder read head and an encoder strip for regulating motion of an assembly holding the array over an imaging surface of a photoreceptor along said direction of motion, and
an electronic controller being configured to use the positional indicators to provide positioning control of the array over the imaging surface to allow high resolution imaging to time an emission of the light emitting diodes to cause emissions from the pattern of light emitting diodes to appear as a single column to the photoreceptor opposite the columns of light emitting diodes.

* * * * *